(12) United States Patent
Furuhashi et al.

(10) Patent No.: US 9,672,887 B2
(45) Date of Patent: Jun. 6, 2017

(54) SEMICONDUCTOR MEMORY CAPABLE OF READING DATA WITHOUT ACCESSING MEMORY CELL

(71) Applicant: KABUSHIKI KAISHA TOSHIBA, Minato-ku, Tokyo (JP)

(72) Inventors: Hironobu Furuhashi, Kuwana Mie (JP); Masahiko Nakayama, Kawasaki Kanagawa (JP); Katsuhiko Hoya, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/066,851

(22) Filed: Mar. 10, 2016

(65) Prior Publication Data

US 2017/0069366 A1 Mar. 9, 2017

Related U.S. Application Data

(60) Provisional application No. 62/216,218, filed on Sep. 9, 2015.

(51) Int. Cl.
| | |
|---|---|
| G11C 11/00 | (2006.01) |
| G11C 11/16 | (2006.01) |
| G11C 7/22 | (2006.01) |
| G11C 7/10 | (2006.01) |

(52) U.S. Cl.
CPC ........ *G11C 11/1673* (2013.01); *G11C 7/1078* (2013.01); *G11C 7/22* (2013.01); *G11C 11/161* (2013.01); *G11C 11/1675* (2013.01); *G11C 7/1051* (2013.01); *G11C 11/16* (2013.01)

(58) Field of Classification Search
CPC ..... G11C 7/22; G11C 16/0483; G11C 7/1078; G11C 16/10; G11C 7/1051; G11C 7/1087; G11C 11/16
USPC .............................. 365/158, 189.05, 185.12
See application file for complete search history.

(56) References Cited

U.S. PATENT DOCUMENTS

| | | | |
|---|---|---|---|
| 8,375,169 B2 | 2/2013 | Sugahara et al. | |
| 8,675,419 B2 * | 3/2014 | Kajigaya | G11C 5/02 365/189.05 |

FOREIGN PATENT DOCUMENTS

| | | |
|---|---|---|
| JP | 2007164355 A | 6/2007 |
| JP | 2013191263 A | 9/2013 |

* cited by examiner

*Primary Examiner* — David Lam
(74) *Attorney, Agent, or Firm* — Holtz, Holtz & Volek PC

(57) ABSTRACT

According to one embodiment, a semiconductor memory includes a first memory cell stably storing data after a first time from an end of a write operation, a buffer latching the data in the write operation, and a control circuit controlling a first read operation when the first read operation is executed right after the write operation for the first memory cell is executed, where the first read operation is an operation for the first memory cell, and the first read operation is an operation reading the data from the buffer without accessing the first memory cell.

20 Claims, 14 Drawing Sheets

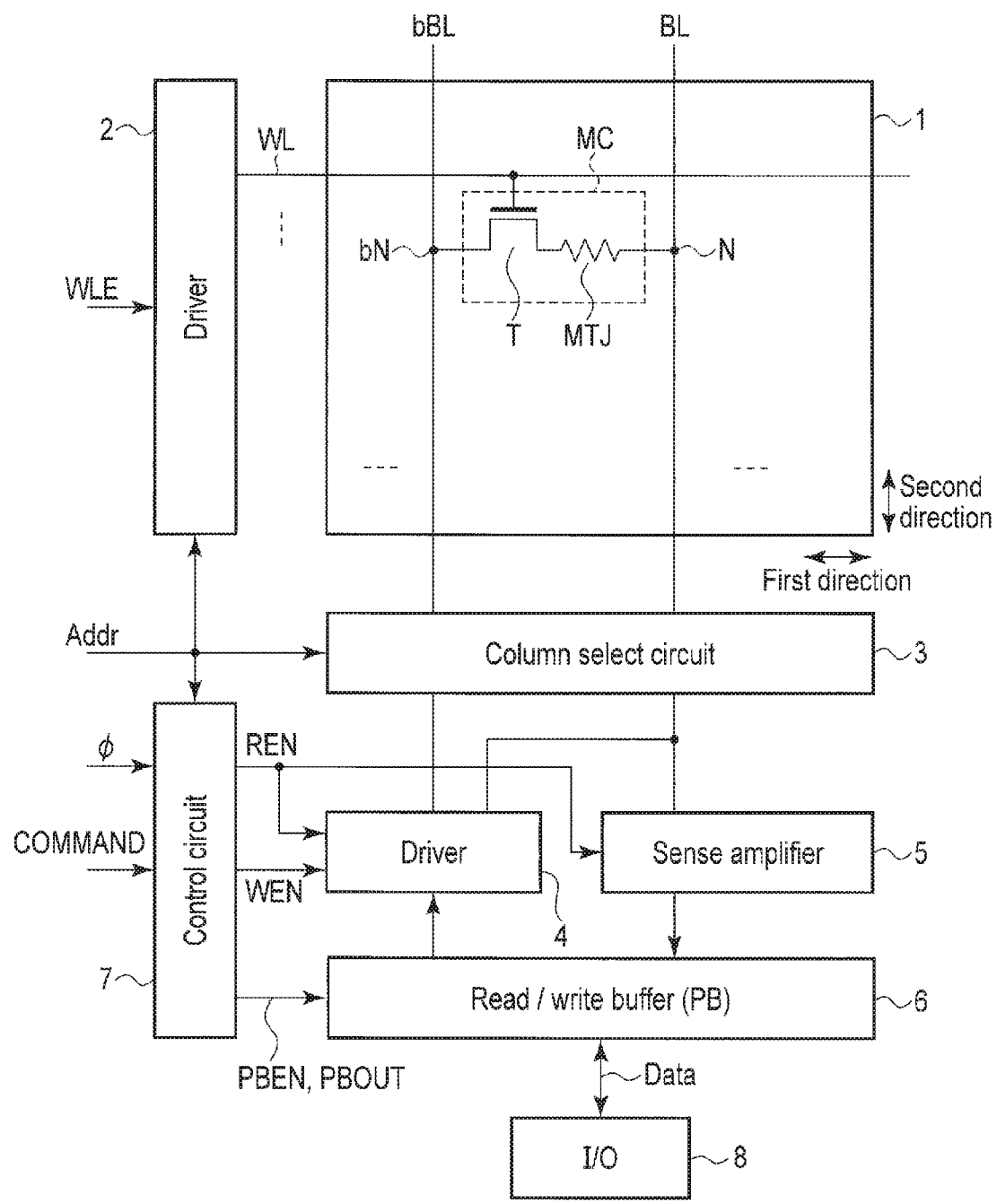
F I G. 1

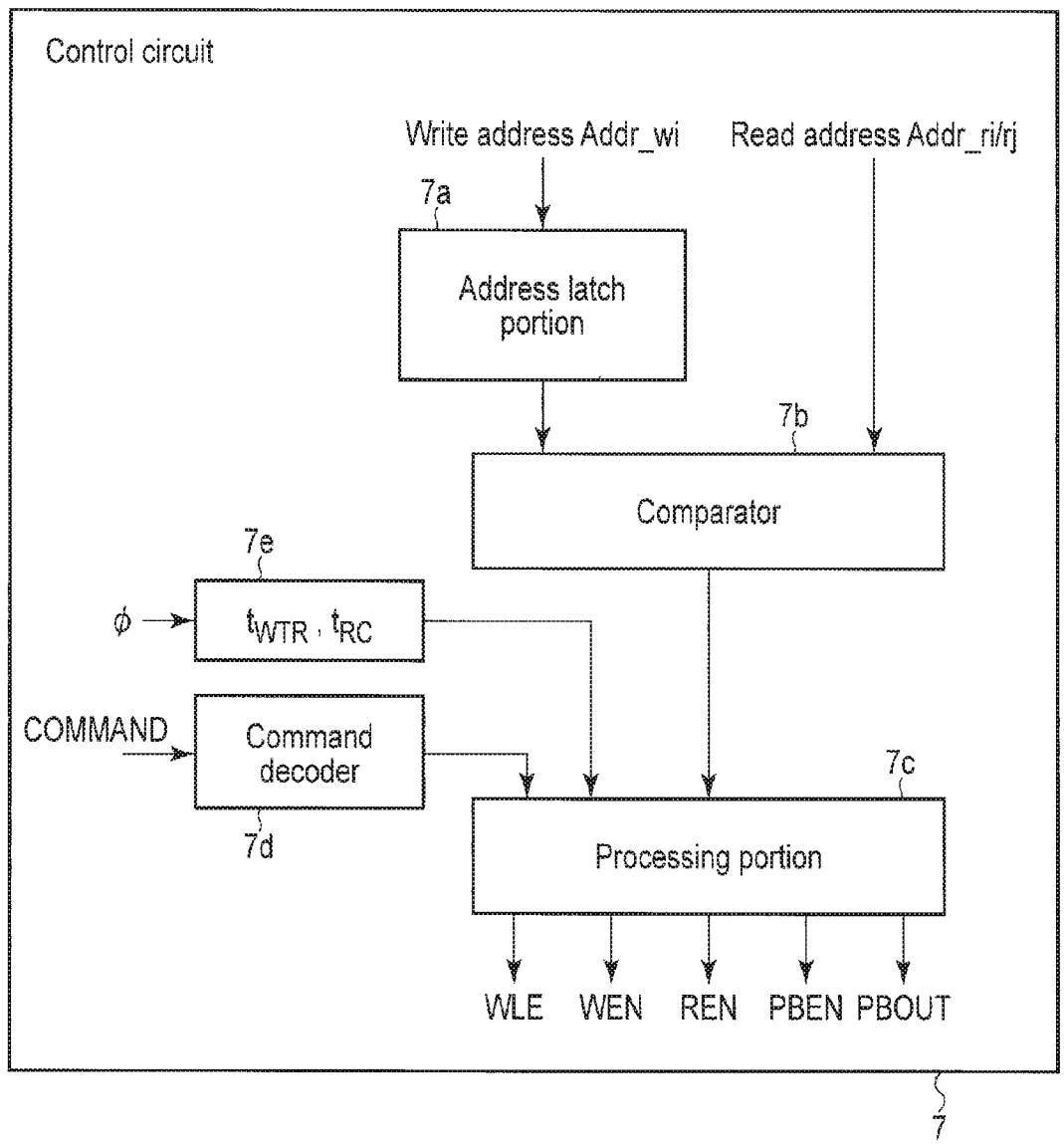
F I G. 4

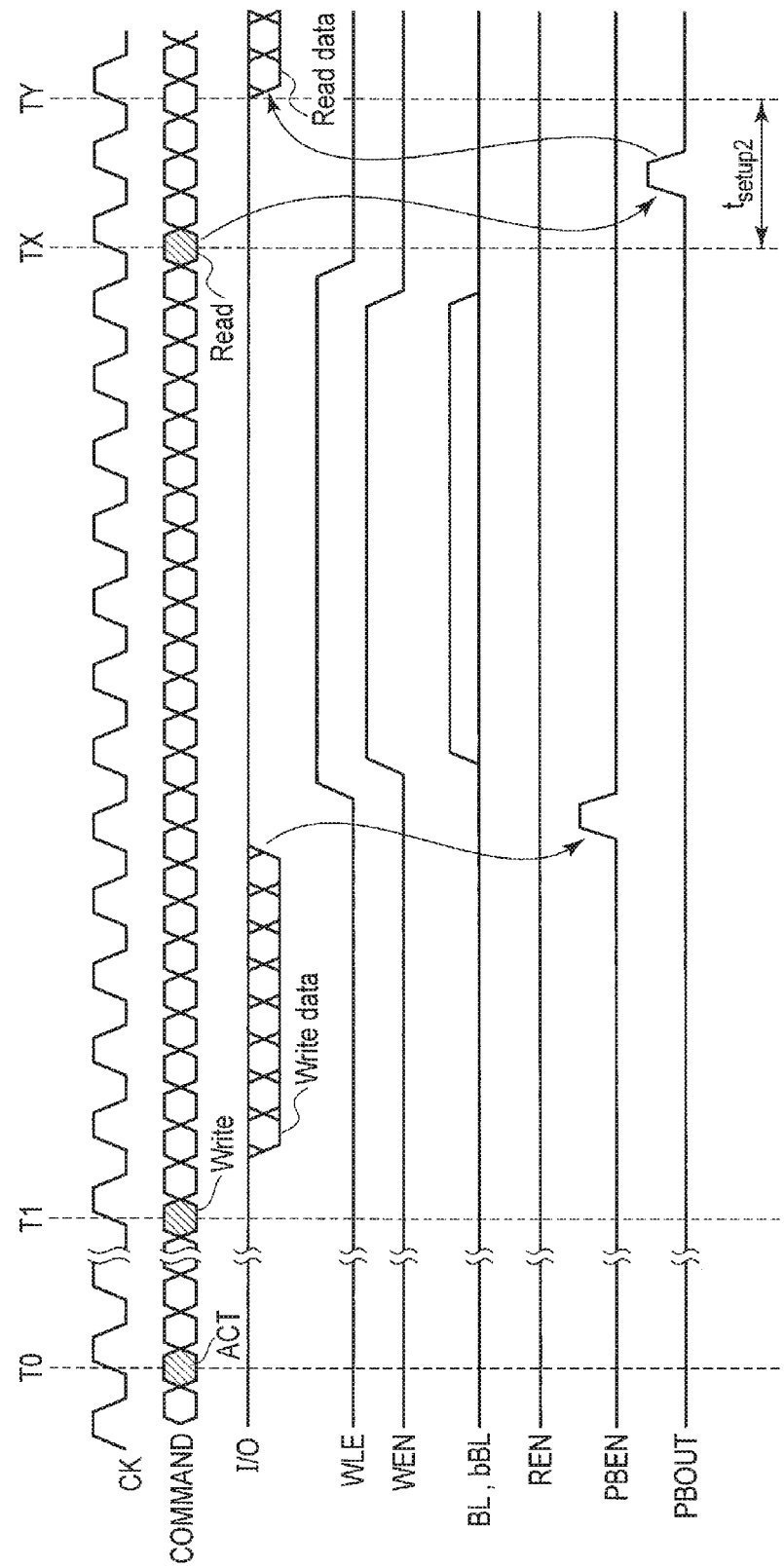
F I G. 9

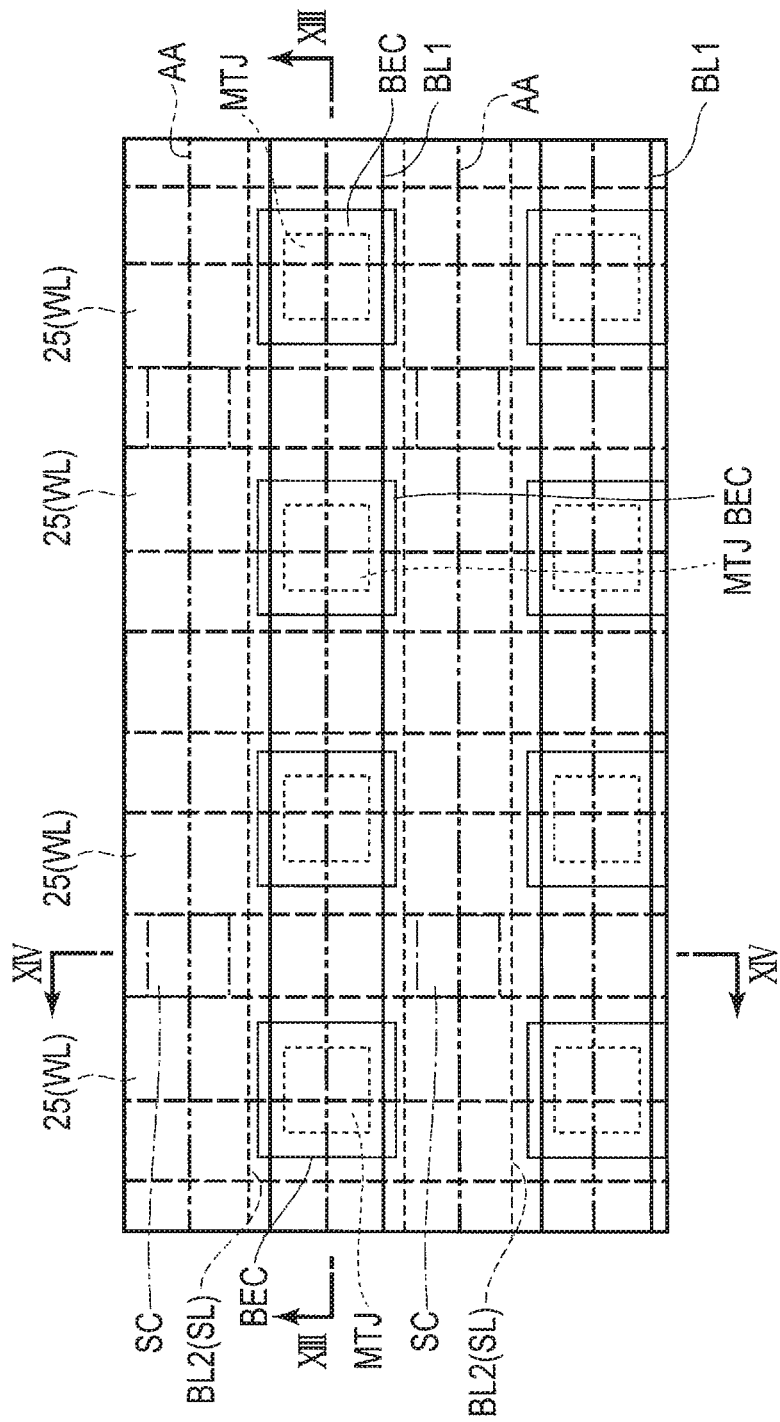
F I G. 12

SEMICONDUCTOR MEMORY CAPABLE OF READING DATA WITHOUT ACCESSING MEMORY CELL

CROSS-REFERENCE TO RELATED APPLICATIONS

This application claims the benefit of U.S. Provisional Application No. 62/216,218, filed Sep. 9, 2015, the entire contents of which are incorporated herein by reference.

FIELD

Embodiments described herein relate generally to a semiconductor memory.

BACKGROUND

For example, in a spin torque transfer magnetic random access memory (STT-MRAM), magnetoresistive elements are used as memory cells. Also, for example, a magnetoresistive element includes a storage layer (magnetic layer), a reference layer (magnetic layer) and a nonmagnetic insulating layer (tunnel barrier layer) between those magnetic layers. The magnetoresistive element further includes a shift canceling layer for canceling the shift of a magnetic characteristic of the storage layer which occurs due to a stray magnetic field from the reference layer. The reference layer and the shift canceling layer are antiferromagnetic-coupled (SAF-coupled: synthetic-antiferromagnetic-coupled) to each other to have magnetization in opposite directions, with a nonmagnetic conductive layer 15 interposed between them.

BRIEF DESCRIPTION OF THE DRAWINGS

FIG. 1 is a view showing a semiconductor memory according to an embodiment.

FIG. 4 is a view showing an example of a control circuit.

FIG. 9 is a waveform chart of buffer read.

FIG. 12 is a view showing a memory cell in an MRAM provided as an example of application.

DETAILED DESCRIPTION

Figure 2:
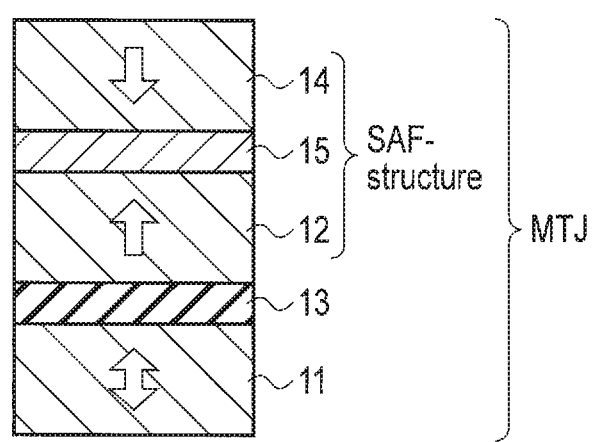
FIG. 2 is a view showing an example of a magnetoresistive element.

In general, according to one embodiment, semiconductor memory comprises: a first memory cell stably storing data after a first time from an end of a write operation; a buffer latching the data in the write operation; and a control circuit controlling a first read operation when the first read operation is executed right after the write operation for the first memory cell is executed, where the first read operation is an operation for the first memory cell, and the first read operation is an operation reading the data from the buffer without accessing the first memory cell.

Embodiment

FIG. 1 shows a magnetic memory according to an embodiment.

A memory cell array 1 includes memory cells MC. To be more specific, a memory cell MC includes an element which stably stores data after a given time elapses from the time at which a write operation ends. Such an element is, for example, a magnetoresistive element.

In this embodiment, the memory cell MC comprises, for example, a magnetoresistive element MTJ and a select transistor (field effect transistor, [FET]) T which are connected in series to each other between two nodes N and bN.

The magnetoresistive element MTJ is a two-terminal element having ends one of which is connected to node N. One of ends of a current path of the select transistor T is connected to the other end of the magnetoresistive element MTJ, and the other end of the current path is connected to node bN. The select transistor T includes a control terminal (gate) which is connected to a word line WL.

The word line WL extends in a first direction and is connected to a driver 2. The driver 2 drives a word line WL based on address Addr when a word-line enable signal WLE is active.

Bit lines BL and bBL extend in a second direction intersecting the first direction. The bit line BL is connected to node N, and the bit line bBL is connected to node bN. The bit lines BL and bBL are further connected to a driver 4 and a sense amplifier 5, with a column select circuit 3 interposed between the bit lines BL and bBL and the driver 4 and the sense amplifier 5. The column select circuit 3 selects bit lines BL and bBL based on the address Addr.

The driver 4 drives the bit lines BL and bBL when a write enable signal WEN is active. For example, in an AP-write in which the magnetoresistive element MTJ is made in the antiparallel state, the driver 4 causes the potential of the bit line BL to be higher than that of the bit line bBL. In a P-write in which the magnetoresistive element MTJ is made in the parallel state, the driver 4 causes the potential of the bit line bBL to be higher than that of the bit line BL. At this time, the sense amplifier 5 is separated from the bit line BL.

The driver 4 applies, for example, ground potential to the bit line bBL when a read enable signal PEN is active. The sense amplifier 5 detects, for example, the potential of the bit line BL data of the memory cell MC) when the read enable signal REN is active. At this time, the driver 4 is separated from the bit line BL.

A read/write buffer 6 has a function of temporarily storing read data in a read operation and a function of temporarily storing write data in a write operation. The read/write buffer 6 is a page buffer which latches data of a plurality of memory cells (for example, data of a single page) which are accessed in response to a single read/write command.

For example, the read/write buffer 6 latches new data when a buffer enable signal PBEN is active. With the new data, old data in the read/write buffer 6 may be overwritten. Alternatively, after erasure (clearing) of the old data, the new data may be written.

Inc read/write buffer 6 outputs read data latched in the read/write buffer 6 when an output enabling signal PBOUT is active in a read operation.

A control circuit 7 produces based on a command COMMAND, a word-line enable signal WLE, a read enable signal REN, a write enable signal WEN, a buffer au signal PBEN and an output enabling signal PBOUT.

Furthermore, in a read operation immediately after a write operation, if address Addr_wi in the write operation is the same as address Addr_ri in the read operation, the control circuit 7 controls a buffer read in which data at the address Addr_ri is read from the read/write buffer 6 without accessing the memory cell MC. This, however, is executed on the premise that between write and read operations, no other operation (no other mad/write operation) is performed. It will be described later in detail.

Furthermore, φ is a control signal for trimming parameters on which such a buffer read operation as described above is based. The parameters are time $t_{WTR}$ required from the end of the write operation to the start of the read operation immediately after the write operation and time $t_{RC}$ from the start of the read operation to the end of the read operation $t_{RC}$ are trimmed based on the characteristics of the magnetoresistive element MTJ.

In the embodiment, after manufacturing a magnetic memory (chip), the characteristics of magnetoresistive elements MTJ are checked, and based on this checking, a control signal φ is supplied to trim $t_{WTR}$ and $t_{RC}$ (variable). However, after verifying the characteristics of magnetoresistive elements MTJ in advance, a magnetic memory (chip) having optimal $t_{WTR}$ and $t_{RC}$ (variable) may be manufactured based on the above verification. In this case, the control signal φ can be omitted.

An input/output (I/O) buffer 8 functions as an interface between the inside and the outside of the magnetic memory.

The characteristics of the magnetoresistive element MTJ will be explained.

The magnetoresistive element MTJ, as shown in FIG. 2, comprises a storage layer (magnetic layer) 11, a reference layer (magnetic layer) 12 and a nonmagnetic insulating layer (tunnel barrier layer) 13. Also, the magnetoresistive element MTJ includes a shift canceling layer (magnetic layer) 14 for canceling the shift of a magnetic characteristic of the storage layer 11, which is caused by a stray magnetic field from the reference layer 12. The reference layer 12 and the shift canceling layer 14 are magnetically coupled (SAF-coupled) to each other to have magnetization in opposite directions, with a nonmagnetic conductive layer 15 interposed between them.

It is preferable that the storage layer 11 includes CoFeB (cobalt-iron-boron) or FeB (iron-boron), and the reference layer 12 includes CoPt (cobalt-platinum), CoNi (cobalt-Nickel), or CoPd (cobalt-palladium). The nonmagnetic insulating layer 13 comprises, for example, MgO (magnesium oxide) or the like. It is preferable that the shift canceling layer 14 includes CoPt (cobalt-platinum), CoNi (cobalt-Nickel), or CoPd (cobalt-palladium).

A composition ratio of a material in the storage layer 11, the reference layer 12, the nonmagnetic insulating layer 13, or the shift canceling layer 14 is not limited to the above-mentioned examples, and may be changeable. It is the same about a material except the above-mentioned example.

The nonmagnetic conductive layer 15 comprises, for example, a metal layer of Ru (ruthenium) or the Like.

In the present embodiment, the magnetization of the reference layer 12 and that of the shift canceling layer 14 act in respective directions toward the nonmagnetic conductive layer 15; however, they may be set to act in respective directions away from the nonmagnetic conductive layer 15.

Also, in the magnetoresistive element MTJ in the embodiment, the direction of the magnetization of the storage layer 11, that of the reference layer 12 and that of the shift canceling layer 14 are set as directions where they are stacked together, i.e., perpendicular directions perpendicular to a film surface; however, they may be set as an in-plane direction which is parallel to the film surface.

It should be noted that "perpendicular direction" means that the magnetization direction is perpendicular or substantially perpendicular to the film surface (upper/lower surface). In addition, "substantially perpendicular" means that the angle between the direction of residual magnetization and the film surface is set such that $45° < \Theta \leq 90°$.

The direction of magnetization of the storage layer 11 can vary oppositely before and after writing. On the other hand, the direction of magnetization of the reference layer 12 does not vary before or after writing. It should be noted that writing means a spin transfer writing in which spin implantation current (spin-polarized electrons) is made to flow into the magnetoresistive element MTJ, thereby imparting a spin torque to the magnetization of the storage layer 11.

Furthermore, the direction of magnetization of the reference layer 12 does not vary before or after writing; however, it varies during writing. It should be noted that "during writing" means a period from the time a write operation is started to the time the magnetization of the magnetoresistive element MTJ stabilizes (data is stored stably).

Therefore, even after ending of a write operation performed in response to a write command, there is a case where the "during writing" state continues. For example, even after the magnetization of the storage layer 11 is reversed, and the write operation is ended, if the magnetization of the reference layer 12 does not stabilize, this state is "during writing".

It is possible that during writing, the direction of magnetization of the reference layer 12 is kept unchanged, by adjusting material parameters (exchange-coupling magnetic field, anisotropy field, etc.). This, however, tends to increase the thickness of the shift canceling layer and that of the reference layer, thus increasing the aspect of a memory device and also raising the degree of the difficulty of processing of the memory element.

In view of the above, in the embodiment, the direction of magnetization of the reference layer 12 is permitted to vary during writing.

Figure 3:
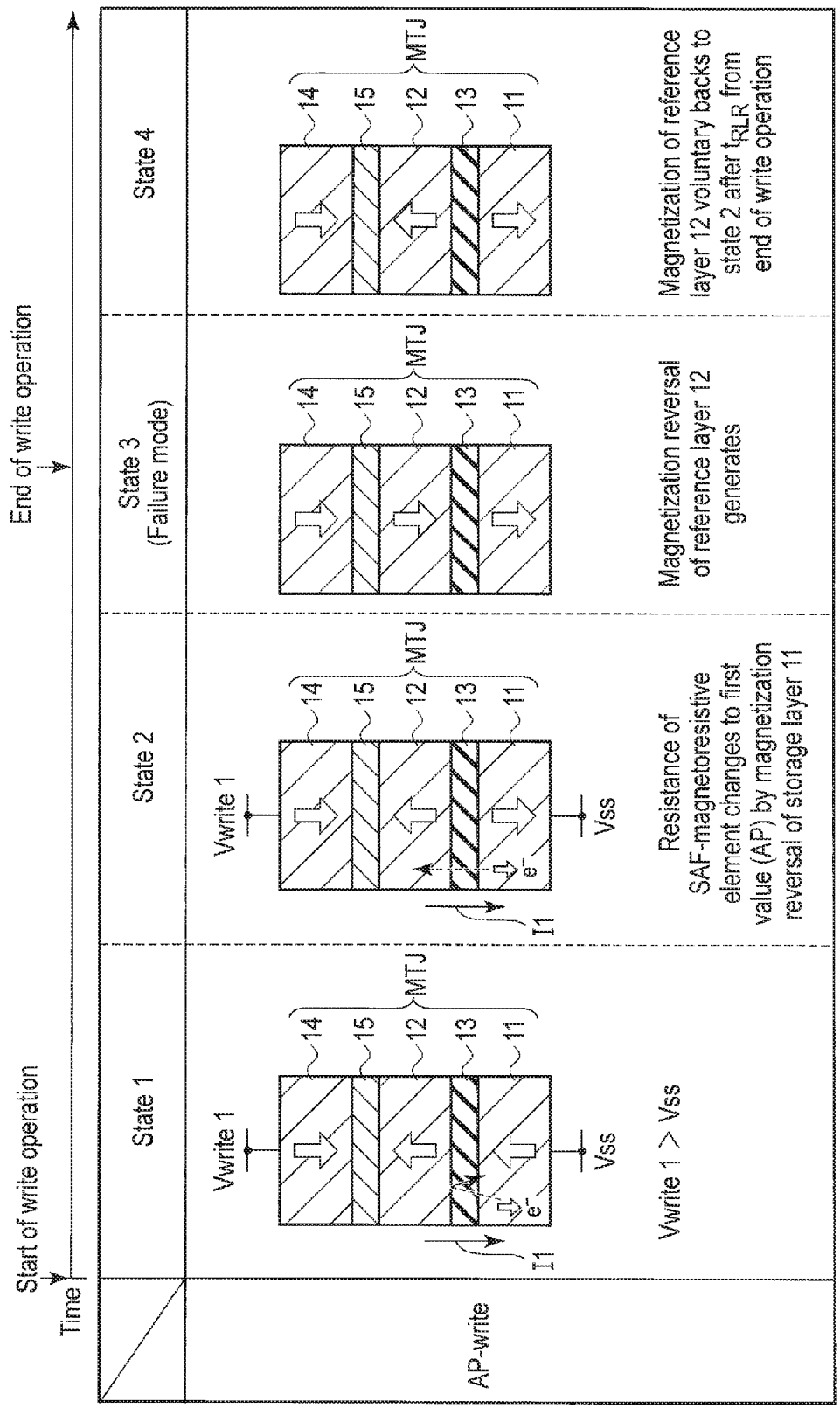
FIG. 3 is a view showing an example of the state of the magnetoresistive element at a write time.

FIG. 3 shows an example of states of the magnetoresistive element MTJ before writing, during writing and after writing.

The write operation is an AP-write in which the state of the magnetoresistive element MTJ is changed from the parallel state to the antiparallel state.

Before writing (state 1), the magnetoresistive element MTJ is in the parallel state. That is, the direction of magnetization of the storage layer 11 and that of the reference layer 12 are the same as each other. In this state, for example, if ground potential Vss is applied to the storage layer 11, and a positive potential Vwrite1 is applied to the shift canceling layer 14, spin, implantation current (write current) I1 flows from the shift canceling layer 14 toward the storage layer 11.

At this time, of electrons directing from the storage layer 11 toward the reference layer 12, electrons spin-polarized in a direction opposite to the direction of magnetization of the reference layer 12 are reflected at the reference layer 12 and are returned into the storage layer 11. As a result, the storage layer 11 receives a spin torque the direction of which is opposite to the direction of magnetization of the reference layer 12. Thus, the state of the magnetoresistive element MTJ changes to the antiparallel state, in which the direction of magnetization of the storage layer 11 and that of the reference layer 12 are opposite to each other (state 2).

Thereafter, if spin implantation current I1 continuously flows from the shift canceling layer 14 toward the storage layer 11, of electrons directing from the storage layer 11 toward the reference layer 12, electrons spin-polarized in a direction which is the same as the direction of the magnetization of the storage layer 11 are injected into the reference layer 12. As a result, the reference layer 12 receives a spin torque the direction of which is the same as that of the magnetization of the storage layer 11. Thus, the direction of magnetization of the reference layer 12 is reversed to be the same as that of the storage layer 11 (state 3).

This reversed state of magnetization of the reference layer 12 (state 3) is a failure mode. That is, in this state, if a read operation is performed, correct data cannot be read. This state continues even after the end of a write operation.

However, the reference layer 12 and the shift canceling layer 14 are SAF-coupled to each other. Furthermore, the coercivity or magnetization stability of the shift canceling layer 14 is higher than the coercivity or magnetization stability of the reference layer 12. Thus, when a given time elapses from the end of the write operation, the direction of magnetization of the reference layer 12 voluntarily changes back to its original one, i.e., the state changes back to the original state (state 2) because of the effect of the SAF-coupling of the reference layer 12 and the shift canceling layer 14 (state 4).

In such a manner, the magnetoresistive element MTJ has a characteristic in which the direction of magnetization of the reference layer 12 is not stable for a given time after the end of the write operation.

It should be noted that the time required from the time at which a write operation ends to the time at which the magnetization of the reference layer 12 of the magnetoresistive element MTJ stabilizes, i.e., a given time required from the time at which the write operation ends to the time at which the magnetoresistive element MTJ stores data stably, is defined as $t_{RLR}$.

Furthermore, based on the above characteristic ($t_{RLR}$), time $t_{WTR}$ required from the end of the write operation to the start of a read operation immediately after the write operation and time tRC required from the start to the end of the read operation are determined.

For example, the condition $t_{WTR} < t_{RLR}$ is set.

This is because $t_{WTR}$ is relatively short to satisfy the specifications of the system, whereas $t_{RLR}$ is relative long to allow variation of the direction of magnetization of the reference layer 12.

In this case, if the read operation is performed immediately after the write operation and also on the same magnetoresistive element MTJ as the write operation, there is a possibility that correct data cannot be read. This is because the magnetoresistive element MTJ to be subjected to the read operation is, for example, in state 3 (failure mode) as shown in FIG. 3.

Hence, in such a case, in the read operation immediately after the write operation, data is read from the read/write buffer 6 without accessing the magnetoresistive element MTJ (buffer read). Since data of the magnetoresistive element MTJ to be subjected to the read operation is latched in the read/write buffer 6 in a write operation immediately before the read operation, such an operation as described above can be performed.

Also, for example, the condition $t_{RLR} < t_{WTR} + t_{RC}$ is set.

This condition is applied to the case where first and second read operations are successively performed immediately after a write operation.

To be more specific, in the case where the first read operation is performed on a magnetoresistive element MTJ other than the magnetoresistive element MTJ subjected to the write operation, and the second read operation is performed on the magnetoresistive element MTJ subjected to the write operation, data of the magnetoresistive element MTJ on which the second read operation is performed is not located in the read/write buffer 6. This is because in the first read operation, data has been changed, from data of the magnetoresistive element MTJ subjected to the write operation, to data of the magnetoresistive element MTJ on which the first read operation is performed.

Therefore, in the second read operation, it is necessary to access the magnetoresistive element MTJ and read data from the magnetoresistive element MTJ (cell read). At this time, if the magnetoresistive element MTJ is, for example, in state 3 (failure mode) as shown in FIG. 3, there is a possibility that in the second read operation, correct data cannot be read.

In order to prevent the above, the data of the magnetoresistive element MTJ subjected to the write operation needs to be stable at the time of starting the second read operation. Thus, the above condition is set.

If the condition is satisfied, since the data of the magnetoresistive element MTJ subjected to the write operation is stable at the time of starting the second read operation (it is in state 4 as shown in FIG. 3), in the second read operation, correct data can be read from the magnetoresistive element MTJ.

FIG. 4 shows an example of the control circuit.

The control circuit 7 controls an operation for reading data from the read/write buffer without accessing a magnetoresistive element in the case where a read operation is performed immediately after a write operation and also on the same magnetoresistive element as the write operation.

An address latch portion 7a latches in the write operation, the write address Addr_wi of the magnetoresistive element subjected to the write operation.

A comparator 7b compares in the read operation immediately after the write operation, the read address Addr_ri in the read operation with the write address Addr_wi latched by the address latch portion 7a. If the read address Addr_ri is the same as the write address Addr_wi, the comparator 7b outputs to a processing portion 7c an output signal to the effect that the read operation is a buffer read. On the other hand, if the read address Addr_rj is not the same as the write address Addr_wi, the comparator 7b outputs to the processing portion 7c an output signal to the effect that the read operation is a cell read.

A command decoder 7d decodes a command received by a magnetic memory, and outputs to the processing portion 7c an output indicating whether the command is a read command or a write command or another command.

The processing portion 7c controls values of a word-line enable signal WLE, a write enable signal WEN, a read enable signal REN, a buffer enable signal PBEN and an output enabling signal PBOUT based on the kind of the command and the output signal from the comparator 7b, i.e., whether the read operation is a buffer read or a cell read.

Also, the processing portion 7c controls the timings of rising edges/falling edges of the word-line enable signal WLE, the write enable signal WEN, the read enable signal REN, the buffer enable signal PBEN and the output enabling signal PBOUT based on $t_{WTR}$ and $t_{RC}$ stored in a trimming portion 7e.

Figure 5:
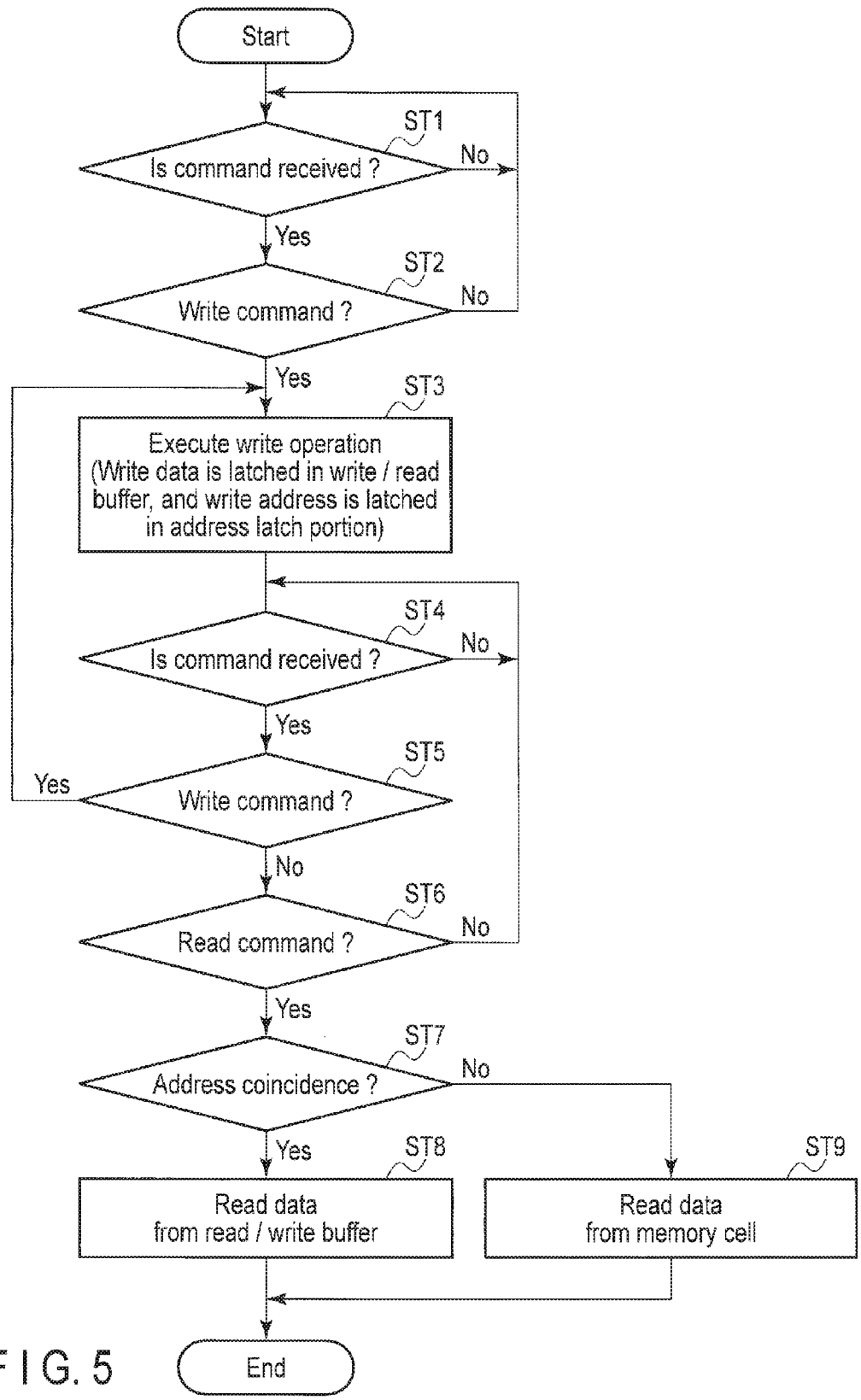
FIG. 5 is a flowchart showing an example of a read operation in the embodiment.
Figure 6:
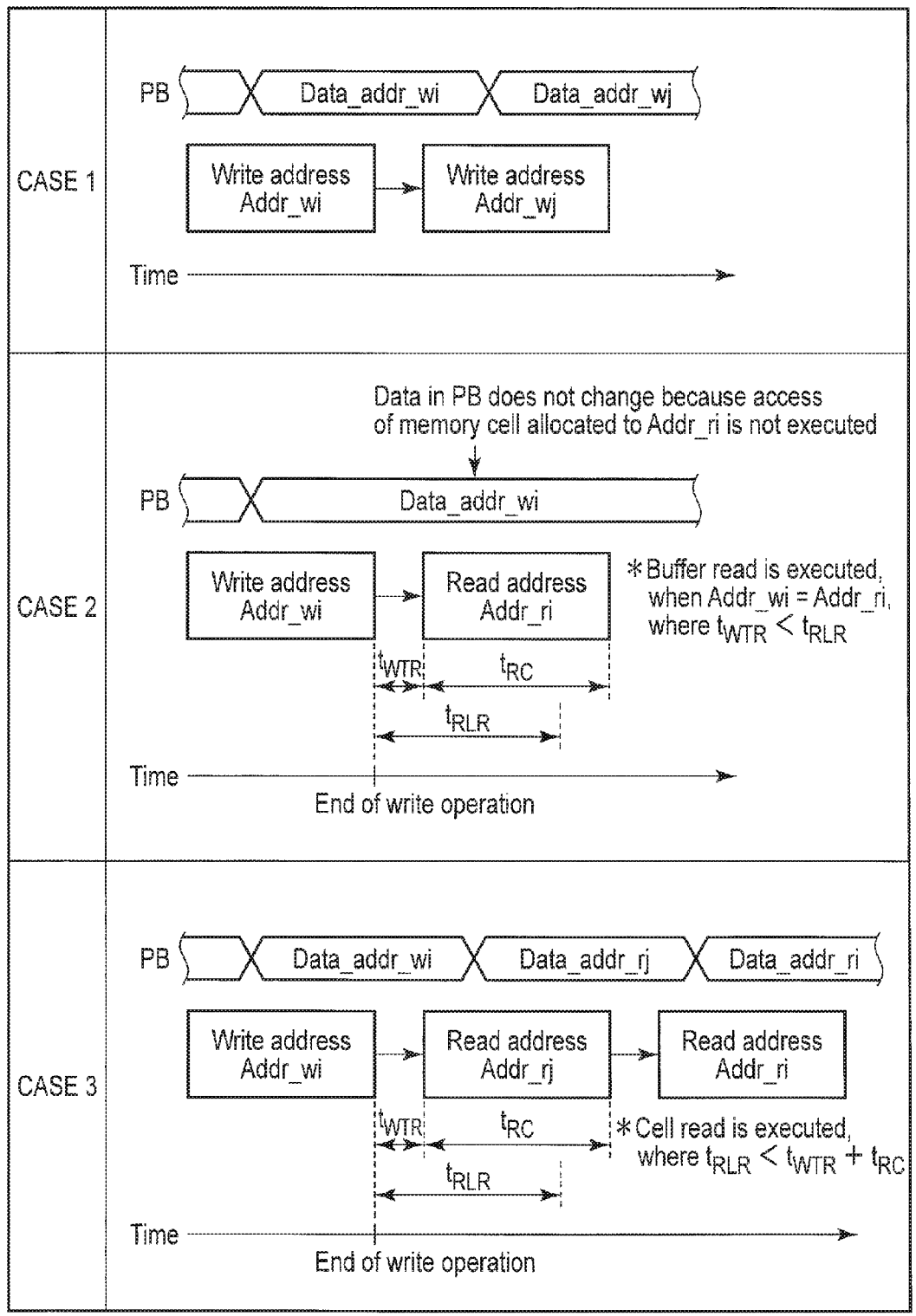
FIGS. 6 and 7 are views showing three cases in an example as shown in FIG. 5.
Figure 7:
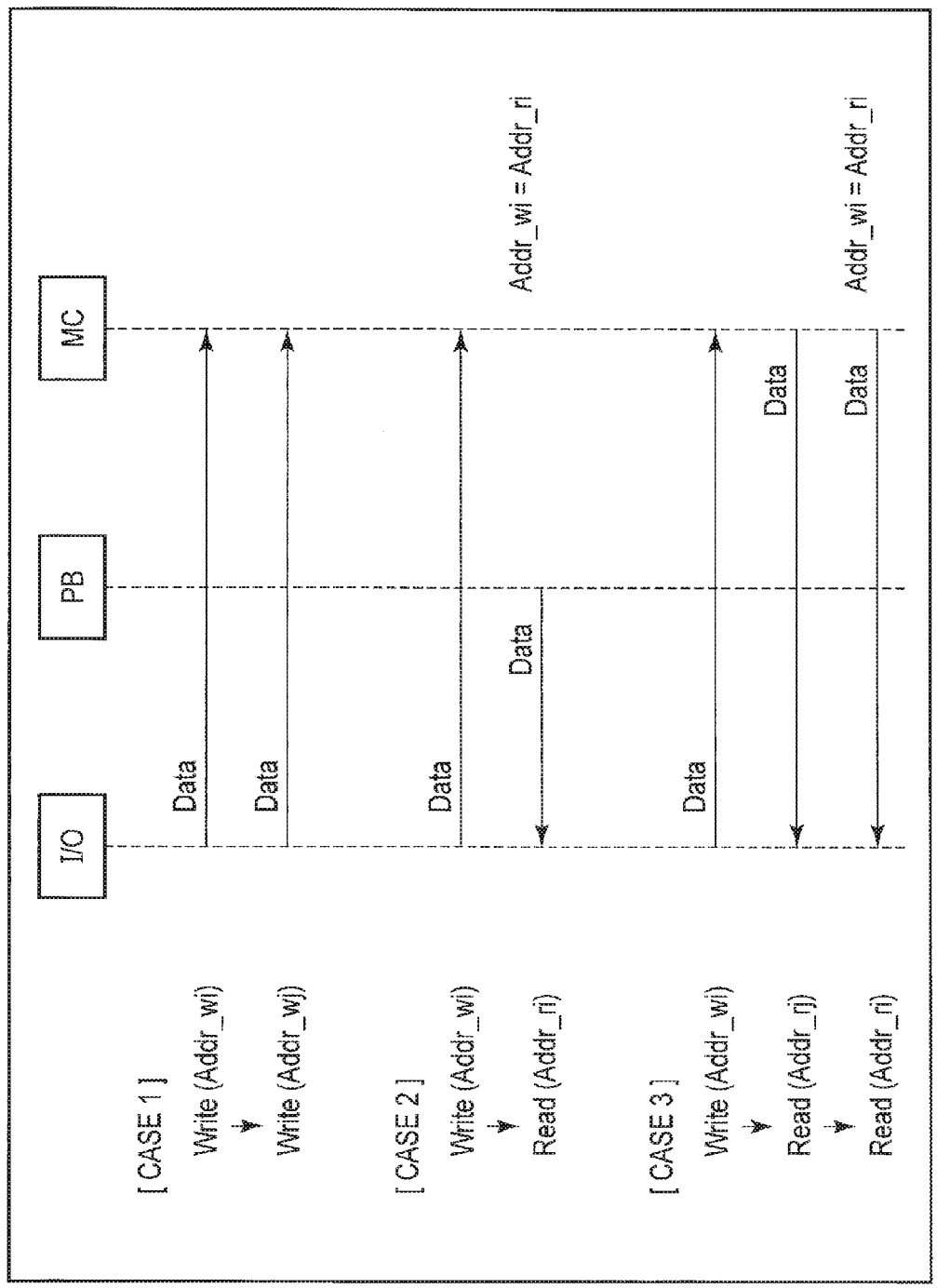

FIG. 5 shows an example of the read operation according to the embodiment. FIGS. 6 and 7 show three cases of the example shown in FIG. 5.

This sequence is executed in, for example, the control portion. 7 as shown in FIGS. 1 and 4.

First, if the control portion 7 receives a command, it confirms whether the command is a write command or not (step ST1→ST2).

If the command received by the control portion 7 is a write command, the control portion. 7 executes a write operation (step ST3). When the write operation is executed, the processing portion 7c in the control portion 7 sets the word-line enable signal WLE, the write enable signal WEN and the buffer enable signal PBEN to "high" level at predetermined timings, respectively.

As a result, write data is latched in the read/write buffer 6 as shown in FIG. 1, and written to the memory cell MC as shown in FIG. 1 through the bit lines BL and bBL as shown in FIG. 1.

Next, if the control portion 7 re-receives a command, it confirms whether the command is a write command or not (steps ST4 and ST5).

If the command received by the control portion 7 is a write command, the control portion 7 re-executes a write operation (step ST5→ST3).

If two write operations are continuously executed, this case corresponds to CASE 1 as shown in FIGS. 6 and 7. In CASE 1, in the first write operation, write data Data_Addr_wi is written to a memory cell MC having write address Addr_wi, and in the second write operation, write data Data_Addr_wj is written to a memory cell MC having write address Addr_wj.

At this time, write data Data_Addr_wi and write data Data_add_wj are both transferred from the input/output (I/O) buffer to the memory cells MC through the read/write buffer (PB). Therefore, data in the read/write buffer (PB) is changed from the Data_Addr_wi to the Data_add_wj.

On the other hand, if the command received by the control portion 7 is not a write command, the control portion 7 confirms whether the command is a read command or not (step ST→ST6).

If the command received by the control portion 7 is a read command, the control portion 7 confirms whether the read address Addr_ri in the present read operation is the same as the write address Addr_wi in a write operation immediately preceding the present read operation or not (step ST7).

If they are the same as each other, the control portion 7 controls the buffer read in which data is read from the read/write buffer 6 as shown in FIG. 1 (step ST7→ST8).

If a read operation is performed immediately after a write operation, and the read address Addr_ri is the same as the write address Addr_wi, this case corresponds to CASE 2 as shown in FIGS. 6 and 7. In CASE 2, in the write operation, write data Data_Addr_wi is transferred from the I/O to a memory cell MC through the read/write buffer (PB). Furthermore, in the read operation, data in a memory cell having the read address Addr_ri is read from the read/write buffer (PB), and an access operation to the memory cell MC is not performed. However, the condition $t_{WTR} < t_{RLR}$ is set.

At this time, write data Data_Addr_wi is latched in the read/write buffer PB for the duration of processing from the write operation to the read operation.

On the other hand, if the above addresses are not the same as each other, the control portion 7 controls the cell read in which data is read from the memory cell MC as shown in FIG. 1 (step ST7→ST9).

If the read operation is performed immediately after the write operation, and the read address ADDr_rj is not the same as the write address Addr_wi, this case corresponds to CASE 3 as shown in FIGS. 6 and 7. In CASE 3, in the write operation, write data Data_Addr_wi is transferred from the I/O to a memory cell MC through the read/write buffer (PB). Also, in the read operation, data in a memory cell MC having the read address ADDr_rj is transferred from the memory cell MC to the I/O through the read/write buffer (PB).

Furthermore, if a further read operation is performed immediately after the read operation, and the read address Addr_ri in the further read operation is the same as the write address Addr_wi, in the read operation, data in a memory cell MC having the read address Addr_ri is transferred from the memory cell MC to the I/O through the read/write buffer (PB). However, the condition $t_{RLR} < t_{WTR} + t_{RC}$ is set.

Figure 8:
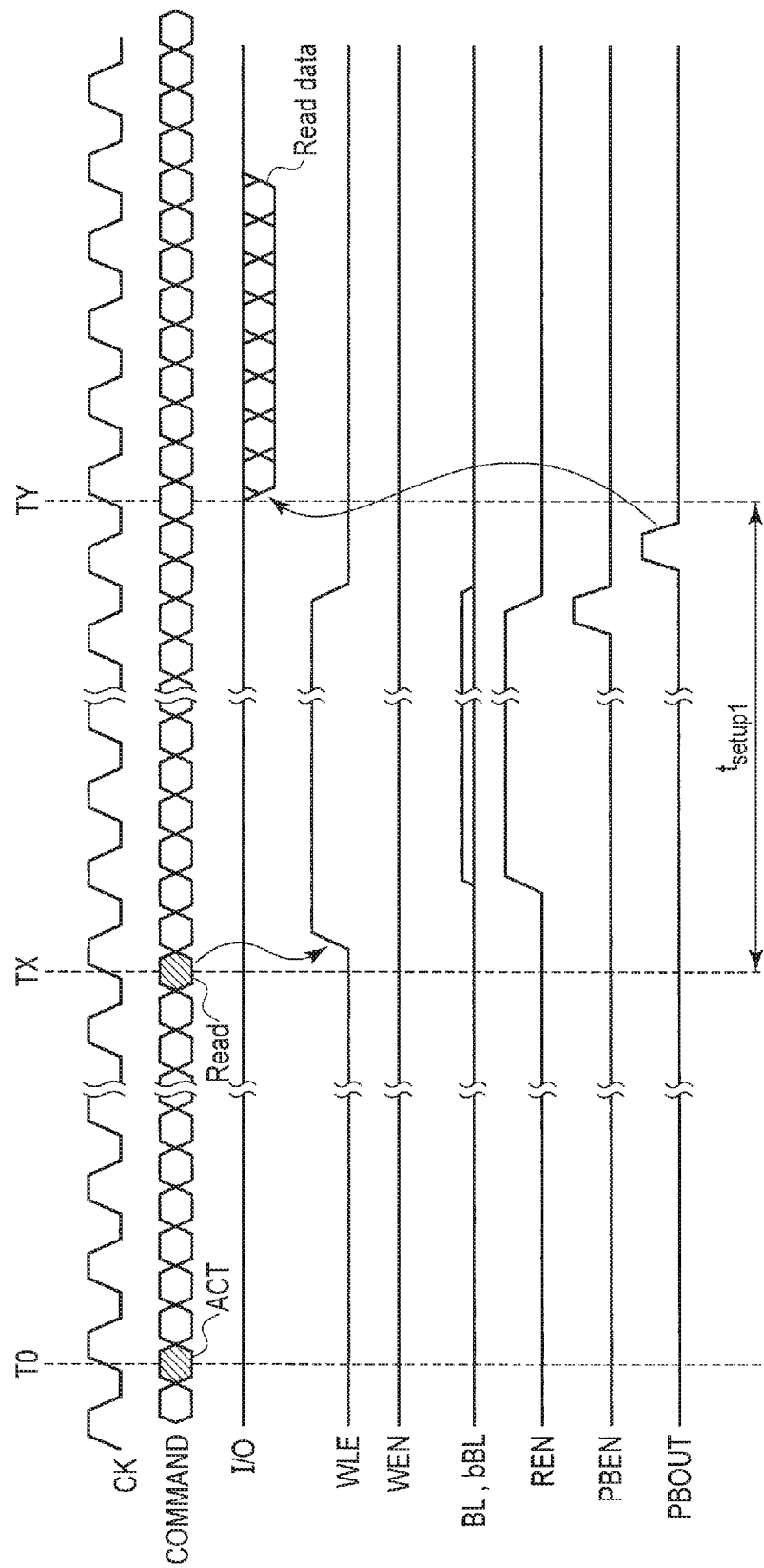
FIG. 8 is a waveform chart of cell read (ordinary read).

FIG. 8 is a waveform chart of the cell read (ordinary read). FIG. 9 is a waveform chart of the buffer read.

In those figures, CM, COMMAND and I/O denote a clock signal, a command and the input/output buffer, respectively. Also, WLE, WEN, BL/bBL, REN, PBEN and PBOUT correspond to WLE, WEN, BL/bBL, BEN, PBEN and PBOUT as shown in FIG. 1 or 4.

The cell read is executed, for example, by issuing a read command at time TX after an active command is issued at time T0. If a read command is issued, WLE, REN, PBEN and PBOUT rise at predetermined timings, whereby the potentials of bit lines BL and bBL are sensed, and read data is output from the I/O. It should be noted that time required from issue of the read command to outputting of the read data from the I/O is denoted by tsetup1.

Then, the following refers to, for example, the case where after an active command is issued at time T0, a write command is issued at time T1, and immediately thereafter, a read command is issued. In this case, first, if a write command is issued, WLE, WEN, PBEN and PBEN rise at predetermined timings, whereby the potentials of bit lines BL and bBL are set to values depending on write data, and a write operation is performed.

Thereafter, if a read command is issued, PBOUT rises at a predetermined timing, and thereby read data is immediately output from the read/write buffer (PB) through the I/O. It should be noted that time required from issue of the read command to outputting of the read data from the I/O is denoted by tsetup2.

tsetup2 is very short in comparison with tsetup1. This is because the buffer read does not need the access operation to the memory cell MC, i.e., an operation for causing WLE, REN and PBEN to rise at the predetermined timings, respectively.

Therefore, according to the embodiment, if a read operation is performed immediately after a write operation, and the read address is the same as the write address, the read operation is a buffer read, thereby allowing the time required from issue of a read command to outputting of read data to be very short. Furthermore, in the buffer read, even if a memory cell to be subjected to reading is in state 3 (failure mode) as shown in FIG. 3, data in the memory cell can cc accurately read. That is, a read disturbance can be restricted.

Modification

Figure 10:
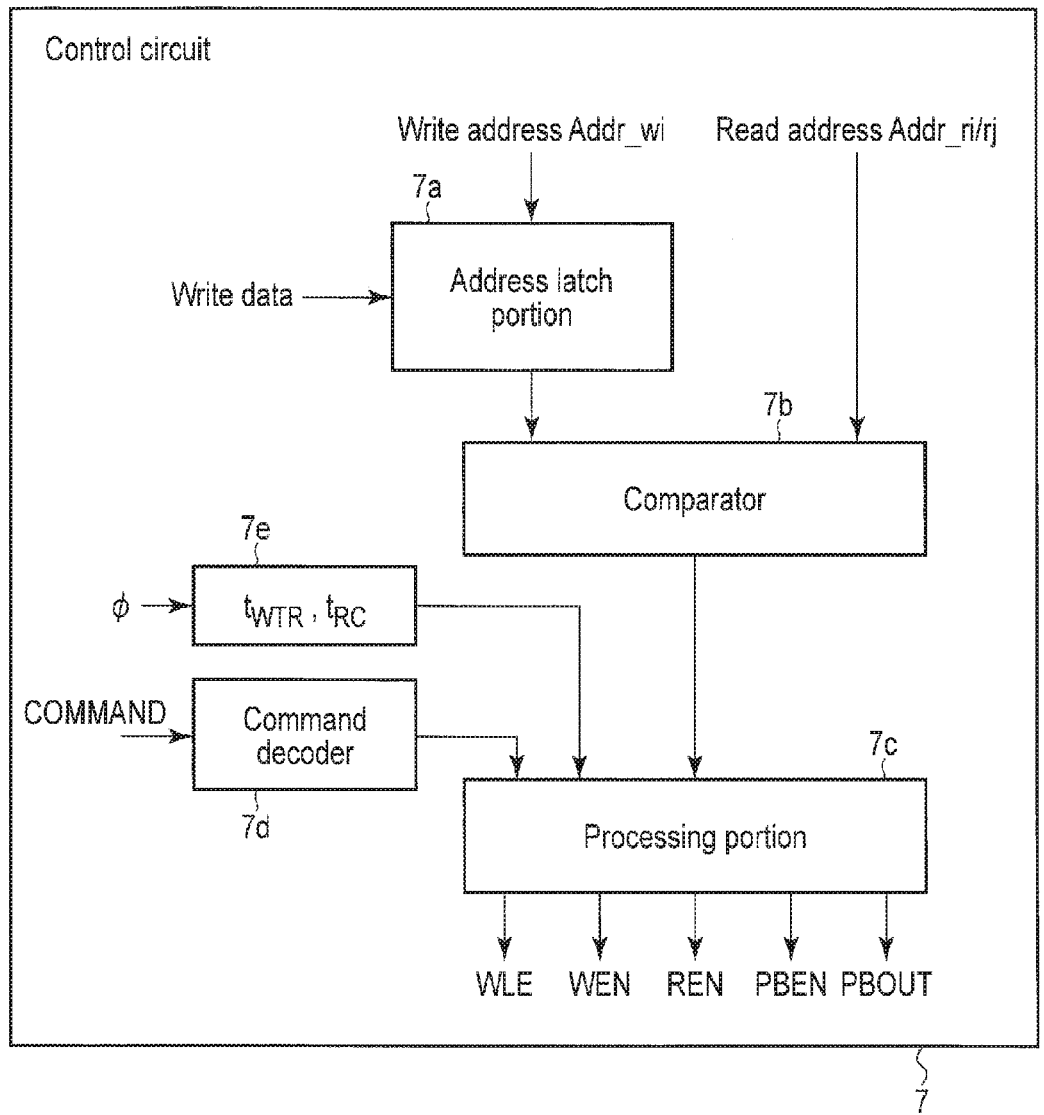
FIG. 10 is a view showing another example of the control circuit.
Figure 11:
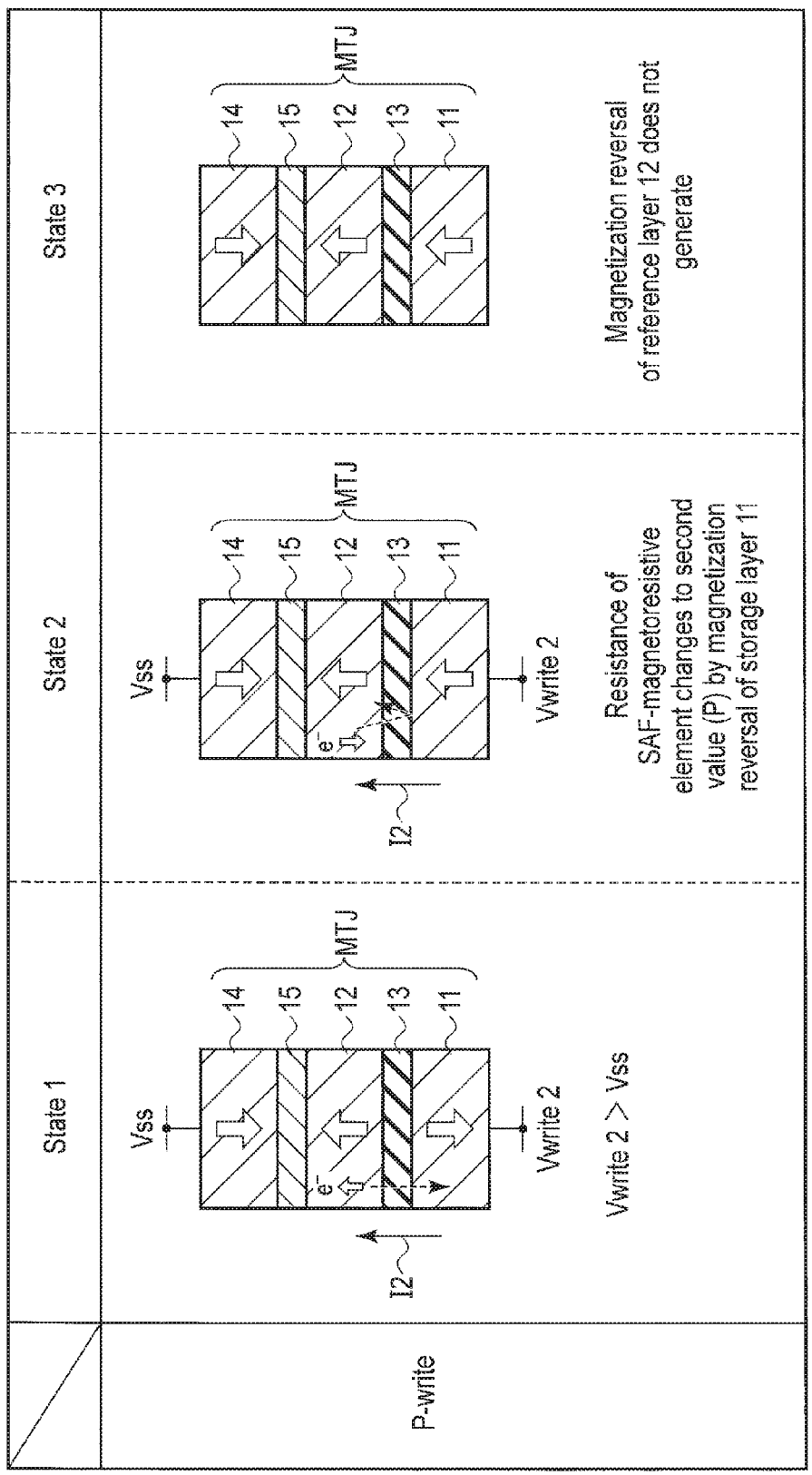
FIG. 11 is a view showing an example of the state of a magnetoresistive element at a write time.

FIGS. 10 and 11 show a modification of the above embodiment. FIG. 10 corresponds to FIG. 4, and FIG. 11 corresponds to FIG. 3.

It is explained above with reference to FIG. 3 that in the AP-write, there is a possibility of a failure mode occurring. On the other hand, in the P-write as shown in FIG. 11, a failure mode does not easily occur. Therefore, in accordance with the value of data in a write operation, it may be determined whether or not to perform the buffer read in a read operation immediately after the write operation. For example, in the read operation immediately after the AP-write, the flow as shown in FIG. 5 may be adopted, and in the read operation immediately after the P-write, the ordinary read (cell read) may be always performed.

In this case, as shown in FIG. 10, the address latch portion 7a determines whether or not to latch a write address in accordance with the write data. To be more specific, if the write data is "1" (AP-write), the write address is latched, and if the write data is "0" (P-write), the write address is not latched.

It will be explained with reference to FIG. 11 why the failure mode does not easily occur in the P-write.

Before writing (state 1), the magnetoresistive element MTJ is in antiparallel state. That is, the direction of magnetization of the storage layer 11 is opposite to that of the reference layer 12. In this state, for example, if positive potential Vwrite2 is applied to the storage layer 11, and ground potential Vss is applied to the shift canceling layer 14, a spin implantation current (write current) I2 flows from the storage layer 11 toward the shift canceling layer 14.

At this time, electrons spin-polarized in a direction which is the same as the direction of magnetization of the reference layer 12 are injected into the storage layer 11. As a result, the storage layer 11 receives a spin torque the direction of which is the same as the direction of magnetization of the reference layer 12. Thus, the magnetoresistive element MTJ changes to be in parallel state (state 2) in which the direction of magnetization of the storage layer 11 is the same as that of the reference layer 12.

Thereafter, if the spin implantation current I2 continuously flows form the storage layer 11 toward the shift canceling layer 14, of electrons directing from the reference layer 12 toward the storage layer 11, electrons spin-polarized in a direction opposite to the direction of magnetization of the storage layer 11 are returned into the reference layer 12. As a result, the reference layer 12 receives a spin torque the direction of which is opposite to the direction of magnetization of the storage layer 11.

However, since the coercivity or magnetization stability of the reference layer 12 is higher than the coercivity or magnetization stability of the storage layer 11, the direction of magnetization of the reference 12 cannot be reversed only with the above returned electrons (electrons spin-polarized in the direction opposite to the direction of magnetization of the storage layer 11).

Therefore, in the P-write, data (magnetization state) stabilizes immediately after the write operation ends (state 3).

In view of the above, for example, in the read operation immediately after the AP-write, the flow as shown in FIG. 5 may be adopted, and in the read operation immediately after the P-write, the ordinary read (cell read) may be necessarily performed.

Example of Application

Figure 13:
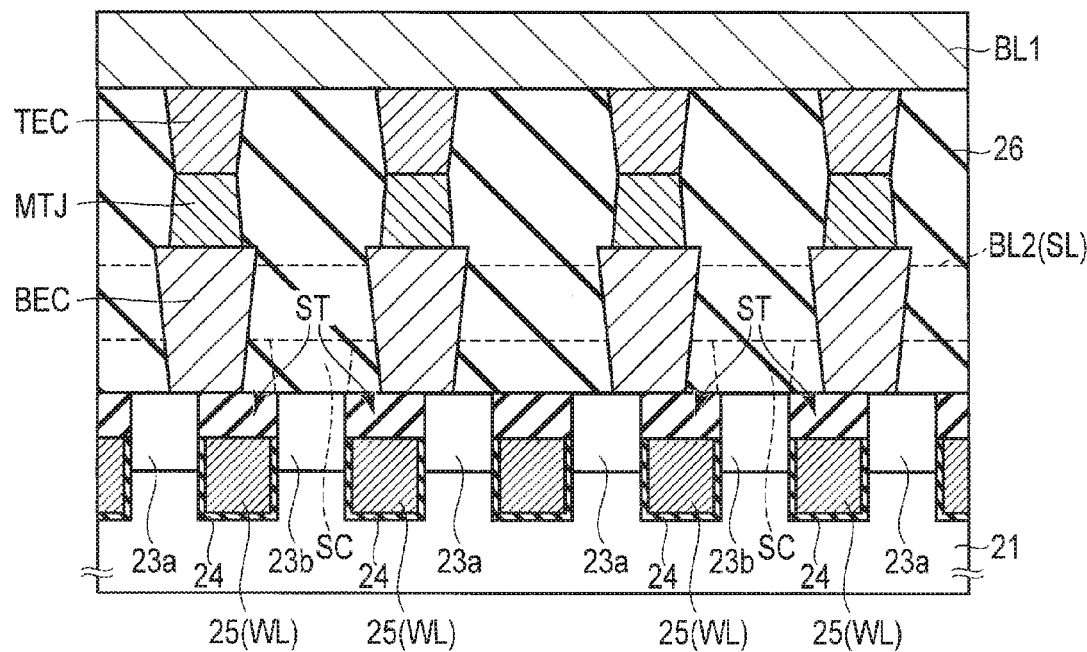
FIG. 13 is a cross-sectional view taken along line XIII-XIII in FIG. 12.
Figure 14:
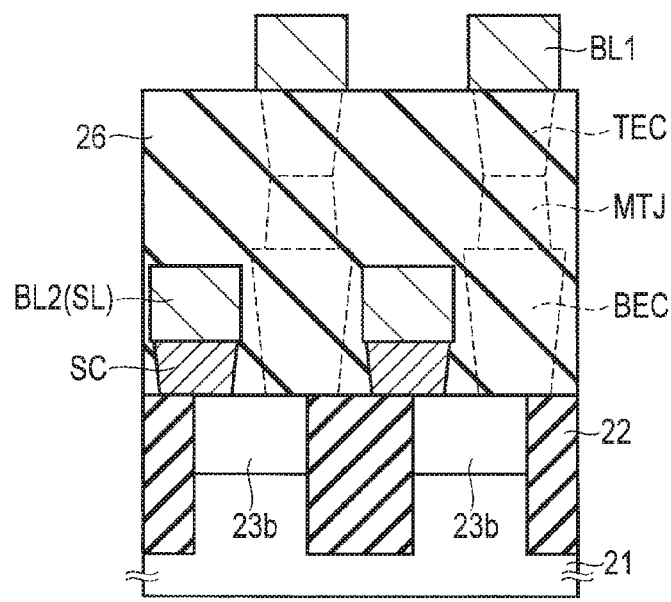
FIG. 14 is a cross-sectional view taken along line XIV-XIV in FIG. 12.

FIGS. 12 to 14 show a device structure of a magnetic random access memory (MRAM) as an example of application. FIG. 12 is a plan view of a memory cell in the MRAM, FIG. 13 is a cross-sectional view taken along line XIII-XIII in FIG. 12, and FIG. 14 is a cross-sectional view taken along line XIV-XIV in FIG. 12.

In this example, the memory cell in the magnetic memory comprises a select transistor (for example, a FET) ST and a magnetoresistive element MTJ.

The select transistor ST is disposed in an active area AA in a semiconductor substrate 21. The active area AA is surrounded by an element isolation insulating layer 22 in the semiconductor substrate 21. In the example, the element isolation insulating layer 22 has a shallow trench isolation (STI) structure.

The select transistor ST comprises source/drain diffusion layers 23a and 23b in the semiconductor substrate 21, and a gate insulating layer 24 and a gate electrode (word line) 25 formed between the source/drain diffusion layers 23a and 23b in the semiconductor substrate 21. The select transistor ST in the example has a so-called embedded gate structure in which the gate electrode 25 is embedded in the semiconductor substrate 21.

An interlayer insulating layer (for example, a silicon oxide layer) 26 covers the select transistor ST. Contact plugs SEC and SC are disposed in the interlayer insulating layer 26. The contact plug BEC is connected to the source/drain diffusion layer 23a, and the contact plug SC is connected to the source/drain diffusion layer 23b. The contact plugs BEC and SC include, for example, one of W (tungsten), Ta (tantalum), Ti (titanium), TiN (titanium nitride), and TaN (tantalum nitride).

The magnetoresistive element MTJ is disposed on the contact plug SEC. Also, the contact plug TEC is disposed on the magnetoresistive element MTJ. The contact plugs TEC includes, for example, one of W (tungsten), Ta (tantalum), Ti (titanium), TiN (titanium nitride), and TaN (tantalum nitride).

A composition ratio of a material, for example, TiN, TaN, in the contact plugs BEC, SC, TEC is not limited to the above-mentioned examples (Ti:N=1:1, Ta:N=1:1), and may be changeable.

A bit line BL is connected to the magnetoresistive element MTJ, with the contact plug TEC interposed between them. A bit line bBL is connected to the source/drain diffusion layer 23b, with the contact plug SC interposed between them. The bit line bBL, for example, also functions as a source line SL to which a ground potential is applied at a read time.

Figure 15:
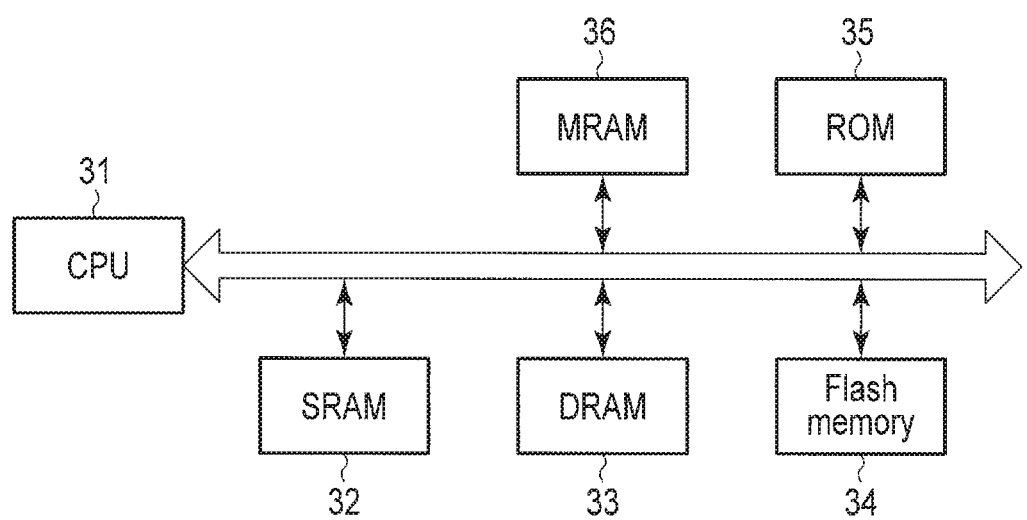
FIG. 15 is a view showing an example of a lower power consumption processor system.

FIG. 15 shows an example of a lower power consumption processor system.

The low power consumption processor system can be achieved by applying an MRAM as a cache memory.

A CPU 31 controls an SRAM 32, a DRAM 33, a flash memory 34, a ROM 35 and an MRAM 36.

For example, when the CPU 31 outputs a write command and write data to the MRAM 36, the MRAM 36 executes a write operation to write the write data to a memory cell. Also, when the CPU 31 outputs a read command to the MRAM 36, the MRAM 36 executes a read operation to read read data from a memory cell.

Furthermore, in accordance with a command from the CPU 31, data may be directly transferred between the MRAM 36 and one of the SRAM 32, the DRAM 33, the flash memory 34 and the ROM 35 (this data transfer includes a read/write operation on the MRAM 36).

In the read operation at, the MRAM 36, one of the buffer read and the cell read is executed according to the above embodiment.

An MRAM 36 can be used in placed of the SRAM 32, the DRAM 33, the flash memory 34 and the ROM 35. Accordingly, at least one of the SRAM 32, the DRAM 33, the flash memory 34 and the ROM 35 may be omitted.

The MRAM 36 can be used as a nonvolatile cache memory (for example, an LE cache).

CONCLUSION

As explained above, according to the embodiment, in the semiconductor memory including memory cells which stably store data after a given time elapses from the end of a write operation, if a memory cell to be subjected to a read operation immediately after the write operation is the same as the memory cell subjected to the write operation, data is read from the read/write buffer without accessing the memory cell.

In this case, without waiting for the elapse of a given time from the end of the write operation, it is possible to immediately execute the read operation to read data of the memory cell from the read/write buffer, not from the memory cell.

Therefore, it is possible to shorten the time required from issue of a read command to outputting of read data, and also to read correct data from the memory cell, even when the data of the memory cell is not stable after the end of the write operation.

By virtue of the above features, it is possible to achieve a semiconductor memory having a high quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a first memory cell stably storing data after a first time from an end of a write operation;
a buffer latching the data in the write operation; and
a control circuit controlling a first read operation when the first read operation is executed right after the write operation for the first memory cell is executed, wherein the first read operation is an operation for the first memory cell, and the first read operation is an operation reading the data from the buffer without accessing the first memory cell.

2. The memory of claim 1, wherein:
the first memory cell comprises a magnetoresistive element including a storage layer, a reference layer, an insulating layer between the storage layer and the reference layer, a shift cancelling layer, and a conductive layer between the reference layer and the shift cancelling layer, and
the reference layer and the shift cancelling layer are SAF-coupled each other.

3. The memory of claim 2, wherein a magnetization direction of the reference layer is stable after the first time from the end of the write operation.

4. The memory of claim 2, wherein the data is stored in the first memory cell by directing magnetization directions of the storage layer and the reference layer to opposite directions.

5. The memory of claim 2, wherein magnetization directions of the storage layer, the reference layer and the shift cancelling layer direct to a direction in which the storage layer, the reference layer and the shift cancelling layer are stacked.

6. The memory of claim 1, wherein the first time from the end of the write operation is longer than a second time from the end of the write operation to a start of the first read operation.

7. The memory of claim 1, wherein the control circuit controls a second read operation when the second read operation is executed right after the first read operation is executed, wherein the first read operation is an operation for a second memory cell other than the first memory cell, the second read operation is an operation for the first memory cell, the second read operation is an operation reading the data from the first memory cell, and the first time is shorter than a sum of a second time from the end of the write operation to a start of the first read operation and a third time from the start of the first read operation to an end of the first read operation.

8. The memory of claim 7, wherein the control circuit comprises a trimming portion optimizing the second and third times by a control signal.

9. The memory of claim 1, wherein the control circuit comprises an address latch portion latching a first address of the first memory cell in the write operation, a comparator comparing a second address of the first read operation with the first address latched in the address latch portion in the first read operation, and a processing portion controlling the first read operation based on an output signal of the comparator.

10. The memory of claim 1, wherein the buffer latches data of memory cells accessed by one read/write command.

11. A semiconductor memory comprising:
a first magnetoresistive element stably storing data after a first time from an end of a write operation;
a buffer latching the data in the write operation; and
a control circuit controlling a first read operation when the first read operation is executed right after the write operation for the first magnetoresistive element is executed, wherein the first read operation is an operation for the first magnetoresistive element, and the first read operation is an operation reading the data from the buffer without accessing the first magnetoresistive element.

12. The memory of claim 11, wherein:
the first magnetoresistive element includes a storage layer, a reference layer, an insulating layer between the storage layer and the reference layer, a shift cancelling layer, and a conductive layer between the reference layer and the shift cancelling layer, and
the reference layer and the shift cancelling layer are SAF-coupled each other.

13. The memory of claim 12, wherein a magnetization direction of the reference layer is stable after the first time from the end of the write operation.

14. The memory of claim 12, wherein the data is stored in the first magnetoresistive element by directing magnetization directions of the storage layer and the reference layer to opposite directions.

15. The memory of claim 12, wherein magnetization directions of the storage layer, the reference layer and the shift cancelling layer direct to a direction in which the storage layer, the reference layer and the shift cancelling layer are stacked.

16. The memory of claim 11, wherein the first time from the end of the write operation is longer than a second time from the end of the write operation to a start of the first read operation.

17. The memory of claim 11, wherein the control circuit controls a second read operation when the second read operation is executed right after the first read operation is executed, wherein the first read operation is an operation for a second magnetoresistive element other than the first magnetoresistive element, the second read operation is an operation for the first magnetoresistive element, the second read operation is an operation reading the data from the first magnetoresistive element, and the first time is shorter than a sum of a second time from the end of the write operation to a start of the first read operation and a third time from the start of the first read operation to an end of the first read operation.

18. The memory of claim 17, wherein the control circuit comprises a trimming portion optimizing the second and third times by a control signal.

19. The memory of claim 11, wherein the control circuit comprises an address latch portion latching a first address of the first magnetoresistive element in the write operation, a comparator comparing a second address of the first read operation with the first address latched in the address latch portion in the first read operation, and a processing portion controlling the first read operation based on an output signal of the comparator.

20. The memory of claim 11, wherein the buffer latches data of magnetoresistive elements accessed by one read/write command.

* * * * *